(12) United States Patent
Kim

(10) Patent No.: US 11,143,913 B2
(45) Date of Patent: Oct. 12, 2021

(54) DISPLAY APPARATUS AND BACKLIGHT UNIT THEREOF

(71) Applicant: Seoul Semiconductor Co., Ltd., Ansan-si (KR)

(72) Inventor: Eun Ju Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 463 days.

(21) Appl. No.: 15/809,259

(22) Filed: Nov. 10, 2017

(65) Prior Publication Data

US 2018/0136520 A1 May 17, 2018

Related U.S. Application Data

(60) Provisional application No. 62/421,454, filed on Nov. 14, 2016, provisional application No. 62/422,157, (Continued)

(51) Int. Cl.
*G02F 1/133* (2006.01)
*G02F 1/13357* (2006.01)
(Continued)

(52) U.S. Cl.
CPC ....... *G02F 1/133606* (2013.01); *G02B 6/003* (2013.01); *G02B 6/0016* (2013.01);
(Continued)

(58) Field of Classification Search
CPC ............. G02F 1/1336; G02F 1/133602; G02F 1/133603; G02F 1/133605;
(Continued)

(56) References Cited

U.S. PATENT DOCUMENTS 8,123,385 B2    2/2012  Ohakawa
8,507,299 B2 *  8/2013  Joo .................. H01L 33/62
                                                    438/26

(Continued)

FOREIGN PATENT DOCUMENTS

CN    101676600    3/2010
CN    104769356    7/2015
(Continued)

OTHER PUBLICATIONS

Google Patents English Translation of KR20150048578A, cited by the applicant, published May 7, 2015. https://patents.google.com/patent/KR20150048578A/en?oq=20150048578 (Year: 2015).*

(Continued)

*Primary Examiner* — Thien M Le
*Assistant Examiner* — April A Taylor
(74) *Attorney, Agent, or Firm* — H.C. Park & Associates, PLC

(57) ABSTRACT

A display apparatus and a backlight unit thereof. The display apparatus includes: a frame; a plurality of light emitting diodes regularly arranged on the frame; an optical part disposed above the plurality of light emitting diodes and including a display panel and at least one of a phosphor sheet and an optical sheet; and a light guide plate disposed between the frame and the optical part to cover the plurality of light emitting diodes, wherein the light guide plate is formed with light source grooves placed corresponding to locations of the plurality of light emitting diodes, respectively, such that light emitted from each of the light emitting diodes enters the corresponding light source groove to spread light in a lateral direction when the light enters the light guide plate, thereby enabling use of a direct type backlight unit without a separate lens.

13 Claims, 14 Drawing Sheets

Related U.S. Application Data filed on Nov. 15, 2016, provisional application No. 62/436,553, filed on Dec. 20, 2016.

(51) Int. Cl.
| | |
|---|---|
| *H01L 25/075* | (2006.01) |
| *F21V 8/00* | (2006.01) |
| *H01L 33/50* | (2010.01) |
| *H01L 33/46* | (2010.01) |
| *H01L 33/54* | (2010.01) |
| *H01L 33/60* | (2010.01) |
| *H01L 33/62* | (2010.01) |

(52) U.S. Cl.
CPC ......... *G02B 6/0021* (2013.01); *G02B 6/0036* (2013.01); *G02B 6/0055* (2013.01); *G02B 6/0073* (2013.01); *G02B 6/0083* (2013.01); *G02F 1/133605* (2013.01); *G02F 1/133608* (2013.01); *G02F 1/133611* (2013.01); *H01L 25/0753* (2013.01); *G02B 6/0043* (2013.01); *G02B 6/0068* (2013.01); *G02F 1/133603* (2013.01); *G02F 2001/133607* (2013.01); *G02F 2001/133614* (2013.01); *H01L 25/0756* (2013.01); *H01L 33/46* (2013.01); *H01L 33/502* (2013.01); *H01L 33/507* (2013.01); *H01L 33/54* (2013.01); *H01L 33/60* (2013.01); *H01L 33/62* (2013.01); *H01L 2933/0091* (2013.01)

(58) Field of Classification Search
CPC ......... G02F 1/133606; G02F 1/133608; G02F 1/133611; G02F 1/133308; G02F 2001/133607; G02F 2001/133614; G02B 6/0013; G02B 6/0033; G02B 6/0035; G02B 6/0036; G02B 6/0038; G02B 6/42; H01L 33/46; H01L 33/52; H01L 33/505; H01L 33/507; H01L 33/60

See application file for complete search history.

(56) References Cited

U.S. PATENT DOCUMENTS

| | | | |
|---|---|---|---|
| 9,465,251 B2 | 10/2016 | Lee et al. | |
| 9,632,355 B2 | 4/2017 | Nam et al. | |
| 10,054,733 B2 | 8/2018 | Lee et al. | |
| 10,573,793 B2* | 2/2020 | Kim | H01L 33/60 |
| 2011/0305003 A1* | 12/2011 | Lee | G02B 6/0021 |
| | | | 362/97.1 |
| 2014/0211121 A1* | 7/2014 | Cho | G02F 1/133603 |
| | | | 349/58 |
| 2015/0268513 A1* | 9/2015 | Chang | G02F 1/133605 |
| | | | 362/97.1 |
| 2016/0087159 A1* | 3/2016 | Kim | H01L 33/46 |
| | | | 257/98 |
| 2017/0023828 A1* | 1/2017 | Lee | G02F 1/133608 |
| 2017/0062664 A1* | 3/2017 | Lin | H01L 33/56 |

FOREIGN PATENT DOCUMENTS

| | | |
|---|---|---|
| KR | 10-0993112 | 11/2010 |
| KR | 10-2014-0076719 | 6/2014 |
| KR | 10-2014-0148272 | 12/2014 |
| KR | 10-2015-0048578 | 5/2015 |
| KR | 10-1597574 | 2/2016 |
| KR | 10-2016-0043215 | 4/2016 |
| KR | 10-2016-0051566 | 5/2016 |
| WO | 2007/011068 | 1/2007 |
| WO | 2016/006781 | 1/2016 |

OTHER PUBLICATIONS

Extended European Search Report dated Jun. 15, 2020, to European Patent Application No. 17870386.4.

Non-Final Office Action dated Mar. 31, 2021, issued to U.S. Appl. No. 17/008,662.

\* cited by examiner

DISPLAY APPARATUS AND BACKLIGHT UNIT THEREOF

CROSS-REFERENCE TO RELATED APPLICATIONS

This application claims priority from and the benefit of U.S. Provisional Patent Application No. 62/421,454, filed on Nov. 14, 2016; U.S. Provisional Patent Application No. 62/422,157, filed on Nov. 15, 2016; and U.S. Provisional Patent Application No. 62/436,553, filed on Dec. 20, 2016, which are each hereby incorporated by reference for all purposes as if fully set forth herein.

BACKGROUND

Field

Exemplary embodiments of the inventive concepts relate to a display apparatus and a backlight unit thereof, and more particularly, to a display apparatus emitting light through a direct type backlight and a backlight unit thereof.

Discussion of the Background

Recently, there is increasing demand for making a display apparatus as thin as possible. Accordingly, for a liquid crystal display (LCD), an edge type backlight unit, including a light source disposed at one side thereof, is generally used.

However, a liquid crystal display including such an edge type backlight unit cannot realize high dynamic range (HDR) imaging, which is a method of producing images on a display screen so as to allow a viewer to experience a sense of viewing an actual scene through the images. In order to realize HDR, it is necessary to realize a difference in luminance of light emitted through the display apparatus depending upon locations on a display screen. However, the liquid crystal display employing the edge type backlight unit cannot realize a difference in luminance of light depending upon locations on the display screen.

Accordingly, various studies have been made to realize HDR through implementation of an active matrix type using a direct type backlight unit. One example of these studies is disclosed in Korean Patent Laid-open Publication No. 10-2016-0051566 (2016 May 11, hereinafter "Prior Document"). However, this publication discloses a display apparatus using a direct type backlight unit and a lens disposed to spread light emitted from a light emitting diode in a lateral direction. However, use of the lens provides a limitation in reduction in thickness of the display apparatus due to the thickness of the lens.

Although a backlight unit typically employs a lens in order to realize uniform surface light throughout the backlight unit by allowing light emitted from the light emitting diode to spread in the lateral direction, it is difficult to improve uniformity of a surface light source even when using the lens.

The above information disclosed in this Background section is only for enhancement of understanding of the background of the inventive concepts and therefor it may contain information that does not constitute prior art.

SUMMARY

Exemplary embodiments of the inventive concepts provide a display apparatus that can reduce a thickness thereof while employing a direct type backlight and a backlight unit thereof.

Exemplary embodiments of the inventive concepts provide a display apparatus that can improve uniformity of a surface light source while employing a direct type backlight.

Additional features of the inventive concepts will be set forth in the description which follows, and in part will be apparent from the description, or may be learned by practice of the inventive concepts.

An exemplary embodiment of the inventive concepts discloses a display apparatus including: a frame; a plurality of light emitting diodes regularly arranged on the frame; an optical part disposed above the plurality of light emitting diodes and including a display panel and at least one of a phosphor sheet and an optical sheet; and a light guide plate disposed between the frame and the optical part to cover the plurality of light emitting diodes. The light guide plate is formed with light source grooves placed corresponding to locations of the plurality of light emitting diodes, respectively, such that light emitted from each of the light emitting diodes enters the corresponding light source groove.

The light source groove may have a concave shape and include a flat upper surface.

The light guide plate may include a regular or irregular roughness formed on an upper surface thereof. The roughness may have a thickness of 5 µm to 500 µm.

The light guide plate may have a thickness of 0.5 mm to 3.0 mm and the light source groove may have a depth corresponding to 70% to 80% of a thickness of the light guide plate.

Each of the light emitting diodes may be a light emitting diode chip.

Each of the light emitting diodes may be a light emitting diode package. Here, the light emitting diode package may include a light emitting diode chip; and a reflector disposed on an upper surface of the light emitting diode chip and reflecting at least part of light emitted from the light emitting diode chip. The reflector may include a distributed Bragg reflector. The reflector may have a transmittance of 0% to 80% with respect to light emitted from the light emitting diode chip.

The light emitting diode package may further include a molding part disposed to cover upper and side surfaces of the light emitting diode chip and the reflector.

The molding part may have a smaller thickness from the upper surface of the reflector to an upper surface of the molding part than a width from the side surface of the light emitting diode chip to a side surface of the molding part.

The width of the molding part from the side surface of the light emitting diode chip to the side surface of the molding part may be 1.5 to 4 times the thickness of the molding part from the upper surface of the reflector to the upper surface of the molding part.

The molding part may include at least one of at least one type of phosphor and at least one type of light diffuser.

The light guide plate may have a light exit groove formed on an upper surface thereof and have a concave shape. The light exit groove may have a conical shape.

The display apparatus may further include a reflection sheet interposed between the light guide plate and the frame and reflecting light inside the light guide plate in an upward direction. The reflection sheet may be separated from the light emitting diode package.

The light guide plate may have a lower surface stepped from a distal end of the light source groove and an inclined surface between the light source groove and the lower surface, and the lower surface may adjoin the reflection sheet.

The lower surface may be a second lower surface and the light guide plate may further include a first lower surface between the inclined surface and the light source groove.

Another exemplary embodiment of the inventive concepts includes a backlight unit of a display apparatus including: a plurality of light emitting diodes; and a light guide plate covering the plurality of light emitting diodes and spreading light emitted from the plurality of light emitting diodes. The light guide plate is formed with light source grooves placed corresponding to locations of the plurality of light emitting diodes, respectively, such that light emitted from each of the light emitting diodes enters the corresponding light source groove.

The light source groove may include a flat upper surface and the light guide plate may include a regular or irregular roughness formed on an upper surface thereof.

The light source groove may have a depth corresponding to 70% to 80% of a thickness of the light guide plate.

The light guide plate may have a light exit groove formed on an upper surface thereof and having a concave shape. The light exit groove may have a conical shape.

The backlight unit may further include a reflection sheet disposed on a lower surface of the light guide plate and reflecting light inside the light guide plate in an upward direction.

The light guide plate may include a first lower surface extending from the light source groove, a second lower surface stepped from the first lower surface, and an inclined surface between the first lower surface and the second lower surface, and the second lower surface may adjoin the reflection sheet.

Another exemplary embodiment of the inventive concepts discloses a display apparatus including: a frame; a plurality of light emitting diode packages regularly arranged on the frame; an optical part disposed above the plurality of light emitting diode packages and including a display panel and at least one of a phosphor sheet and an optical sheet; and a lens disposed between the frame and the optical part to cover each of the light emitting diode packages and spreading light emitted from the corresponding light emitting diode package. Each of the light emitting diode packages includes a light emitting diode chip; and a reflector disposed on an upper surface of the light emitting diode chip and reflecting at least part of light emitted from the light emitting diode chip.

The lens may include a lower surface having a concave portion defining a light incident face through which light enters the lens; and an upper surface through which light exits the lens, and the light emitting diode package may be disposed inside the concave portion of the lens.

The light incident face of the lens may include an upper end portion and a side surface extending from the upper end portion to an entrance of the concave portion, and the concave portion may have a width gradually decreasing from the entrance thereof to the upper end portion.

The side surface may be an inclined surface having a constant inclination from the entrance of the concave portion to the upper end portion or a curved inclined surface having a gradually decreasing inclination from the entrance of the concave portion to the upper end portion.

The upper end portion may be a flat surface or a curved surface.

The reflector may include a distributed Bragg reflector. The reflector may have a transmittance of higher than 0% to less than 100% with respect to light emitted from the light emitting diode chip.

The light emitting diode package may further include a molding part disposed to cover upper and side surfaces of the light emitting diode chip and the reflector.

The molding part may include at least one of at least one type of phosphor and at least one type of light diffuser.

According to exemplary embodiments, a light guide plate of the backlight unit includes a light source groove placed corresponding to a location of a light emitting diode package so as to spread light in a lateral direction when the light enters the light guide plate, thereby enabling use of a direct type backlight unit without a separate lens.

In addition, the exemplary embodiments of the inventive concepts provide a thinner direct type backlight than a typical direct type backlight unit through elimination of a separate lens, thereby enabling reduction in thickness of a display apparatus.

According to exemplary embodiments, as a backlight unit of a display apparatus, light emitting diode packages each having a reflector disposed on a light emitting diode chip are coupled to lenses, respectively, thereby improving uniformity of surface light with respect to light emitted from a plurality of light emitting diode packages.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1A:
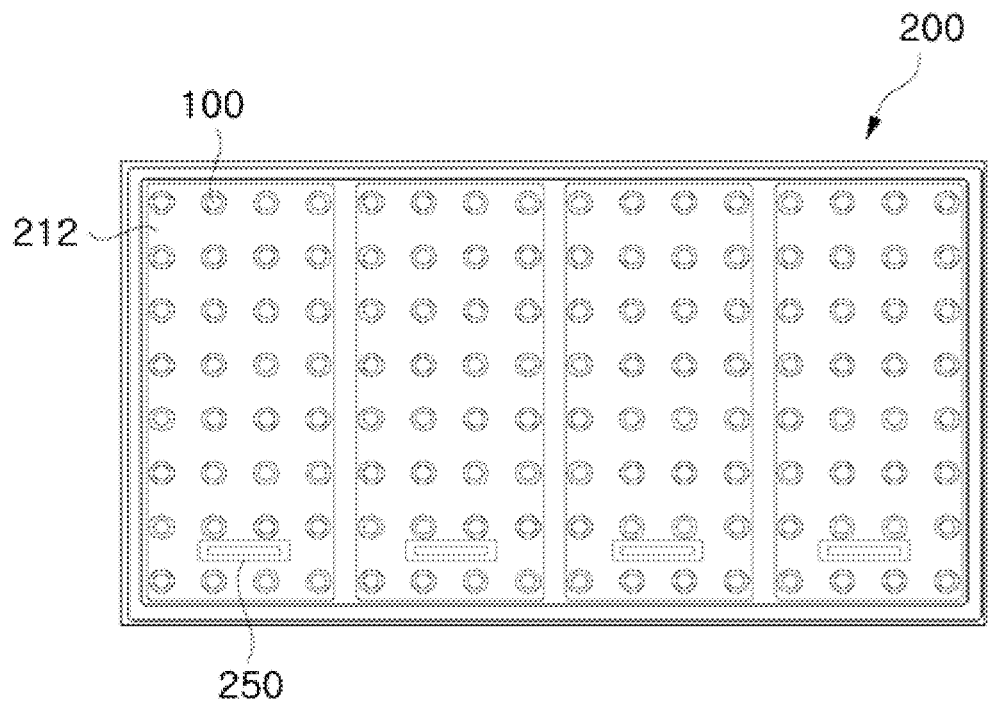
FIG. 1A is a top view of a display apparatus according to a first exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the inventive concepts.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Exemplary embodiments of the inventive concepts will be described in more detail with reference to the accompanying drawings.

Figure 1B:
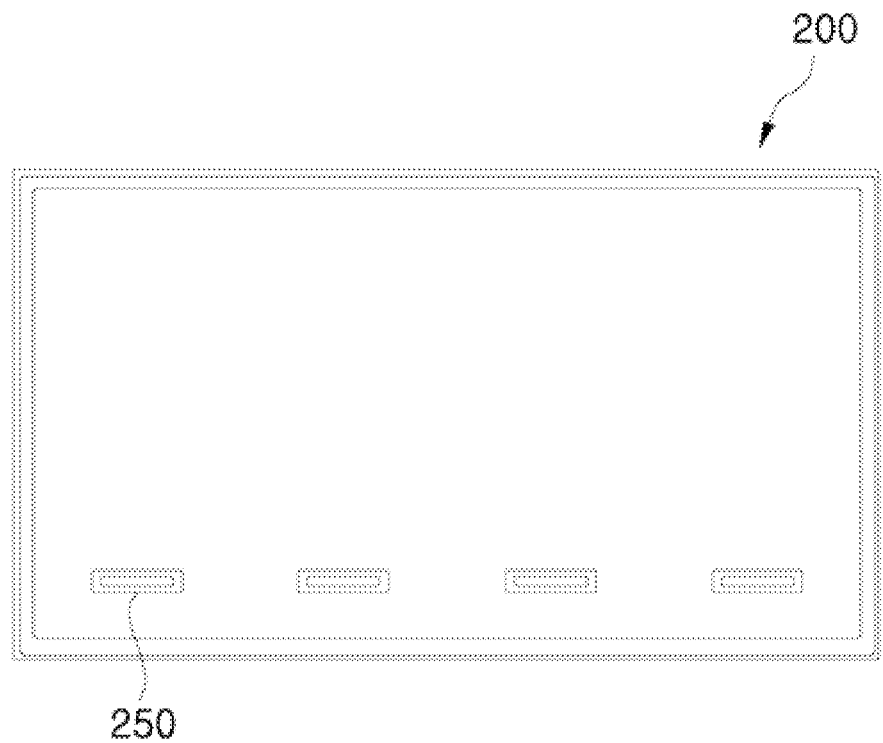
FIG. 1B is a bottom view of the display apparatus according to the first exemplary embodiment of the inventive concepts.
Figure 2A:
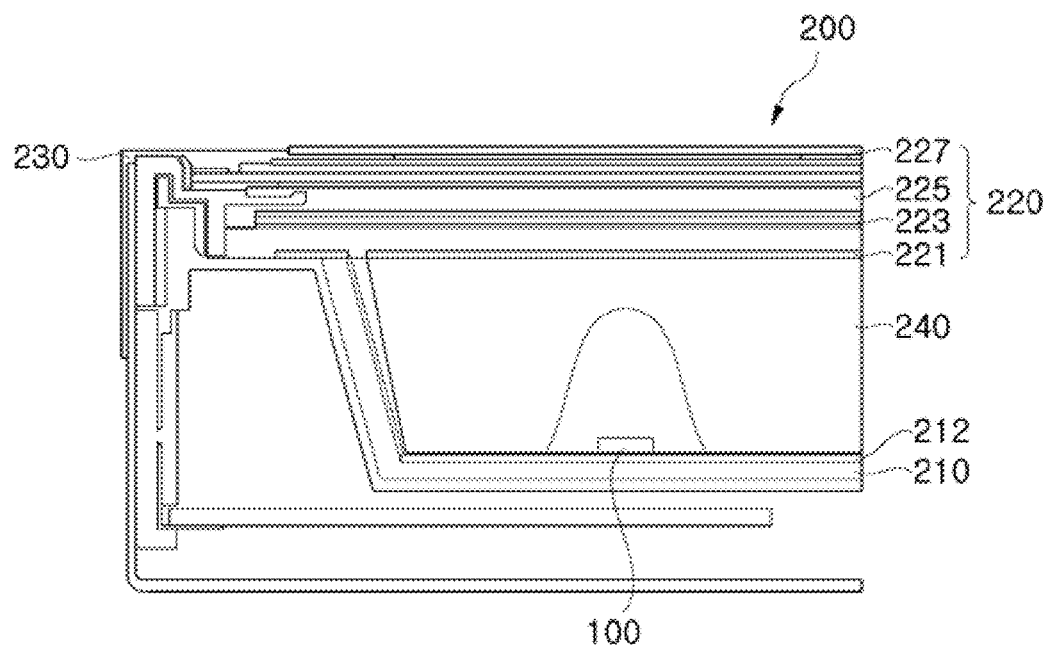
FIG. 2A and FIG. 2B are cross-sectional views of the display apparatus according to the first exemplary embodiment of the inventive concepts.
Figure 2B:
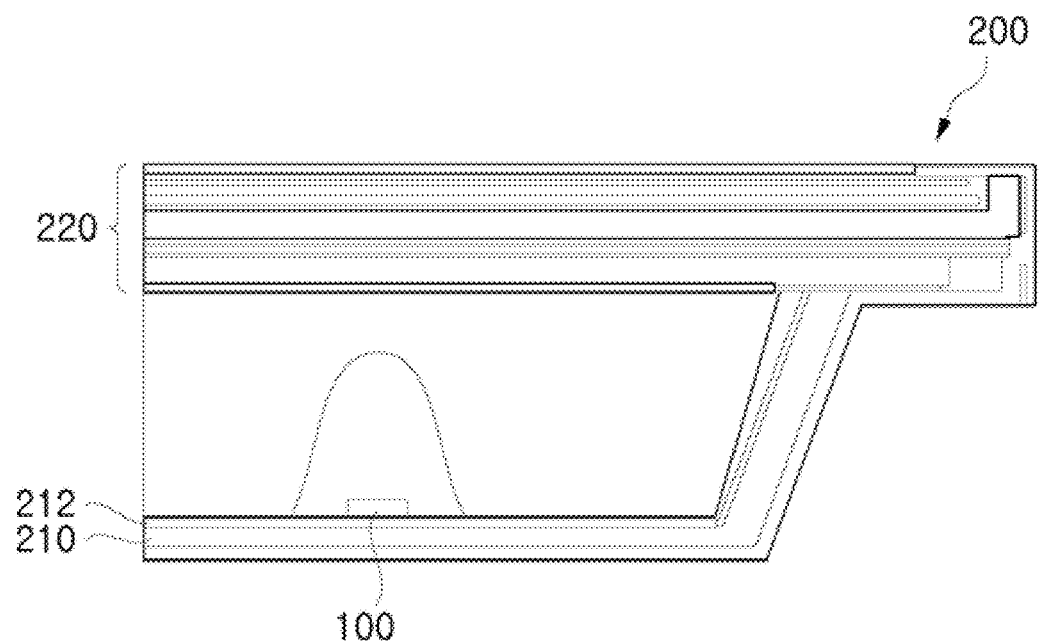

FIG. 1A and FIG. 1B are top and bottom views of a display apparatus according to a first exemplary embodiment of the inventive concepts, respectively, and FIG. 2A and FIG. 2B are cross-sectional views of the display apparatus according to the first exemplary embodiment of the inventive concepts.

A display apparatus 200 according to the first exemplary embodiment of includes light emitting diode packages 100, a front cover 230, a frame 210, an optical part 220, and a light guide plate 240. Each of the light emitting diode packages 100 includes a light emitting diode chip 112, a reflector 114, and a molding part 116, which will be described below.

The front cover 230 may cover part of side and upper surfaces of a display panel 227 of the optical part 220. The front cover 230 may have a hollow center and the display panel 227 may be disposed at the center of the front cover 230 such that an image displayed on the display panel 227 can be viewed outside the display apparatus.

The frame 210 may support the display apparatus 200 and may be coupled to one side of the front cover 230. The frame 210 may be formed of a synthetic resin or a metallic material, such as Al alloys. The frame 210 may be separated a predetermined distance from the optical part 220. The light emitting diode package 100 may be disposed on the frame 210 so as to face the optical part 220. Here, a distance between the frame 210 and the optical part 220 may be an optical distance (OD) from the light emitting diode package 100 to the optical part 220. In this exemplary embodiment, the optical distance (OD) may be, for example, about 1 mm to 15 mm.

The frame 210 may be provided at an upper side thereof with a substrate 212, to which the light emitting diode package 100 is electrically connected. The substrate 212 serves to allow power supply to the light emitting diode package 100 therethrough.

The optical part 220 is disposed above the frame 210, and includes a phosphor sheet 221, a diffusion plate 223, an optical sheet 225, and the display panel 227.

The phosphor sheet 221 serves to perform wavelength conversion of light emitted from the light emitting diode package 100. The phosphor sheet 221 may contain at least one type of phosphor and may further include at least one type of quantum dot (QD). In this exemplary embodiment, the light emitting diode package 100 may emit blue light or UV light, and light emitted through the phosphor sheet 221 may be white light.

The diffusion plate 223 serves to diffuse light in an upward direction upon receiving the light from the light emitting diode package 100.

The optical sheet 225 may be disposed on the diffusion plate 223 and the display panel 227 may be disposed on the optical sheet 225. The optical sheet 225 may include a plurality of sheets having different functions. For example, the optical sheet 225 may include one or more prism sheets and diffusion sheets. The diffusion sheet can provide more uniform brightness by preventing light emitted through the diffusion plate 223 from being partially collected. The prism sheet can collect light emitted through the diffusion sheet to allow the light to enter the display panel 227 at a right angle.

The display panel 227 is disposed on an upper surface of the display apparatus 200 and displays an image. The display panel 227 includes a plurality of pixels and can output an image corresponding to a color, brightness and chroma of each pixel.

As shown in FIG. 2A and FIG. 2B, the light guide plate 240 is interposed between the frame 210 and the optical part 220. The light guide plate 240 serves to allow uniform emission of light towards the optical part 220 upon receiving light. The thickness of the light guide plate 240 may be the same as or less than an optical distance (OD), which is a distance between the frame 210 and the optical part 220. That is, the optical distance corresponding to the distance from light emitting diode package 100 to the optical part 220 may be determined depending upon the thickness of the light guide plate 240. In addition, an air gap may be formed between the light guide plate 240 and the optical part 220.

The light emitting diode package 100 is disposed on the frame 210 and the light guide plate 240 is disposed above the light emitting diode package 100. Here, the light guide plate 240 has a lower surface directly contacting the frame 210 and may be formed with a light source groove h placed corresponding to a location of the light emitting diode package 100. Accordingly, light emitted from the light emitting diode package 100 enters the light guide plate 240 through the light source groove h.

Referring to FIG. 2A and FIG. 2B, the light source groove h may have a concave shape and the shape of the light source groove h can be modified as needed. This will be described below. The number of light source grooves h may correspond to the number of light emitting diode packages 100.

Referring to FIG. 1A, the display apparatus 200 includes a plurality of light emitting diode packages 100 regularly arranged thereon. By way of example, the light emitting diode packages 100 may be arranged in a matrix to be separated at constant intervals from each other.

FIG. 1A shows the structure wherein a plurality of light emitting diode packages 100 is regularly arranged. The display apparatus 200 can provide higher quality of HDR (high dynamic range) with increasing number of light emitting diode packages 100.

In addition, the display apparatus may be provided with a plurality of power supply units 250, which supply electric power to the plurality of light emitting diode packages 100. Each power supply unit 250 can supply power to at least one light emitting diode package 100. In this exemplary embodiment, electric power is supplied to 32 light emitting diode packages 100 through one power supply unit 250. Upon receiving electric power from the power supply unit 250, the plurality of light emitting diode packages 100 can emit light and be individually operated.

Figure 3:
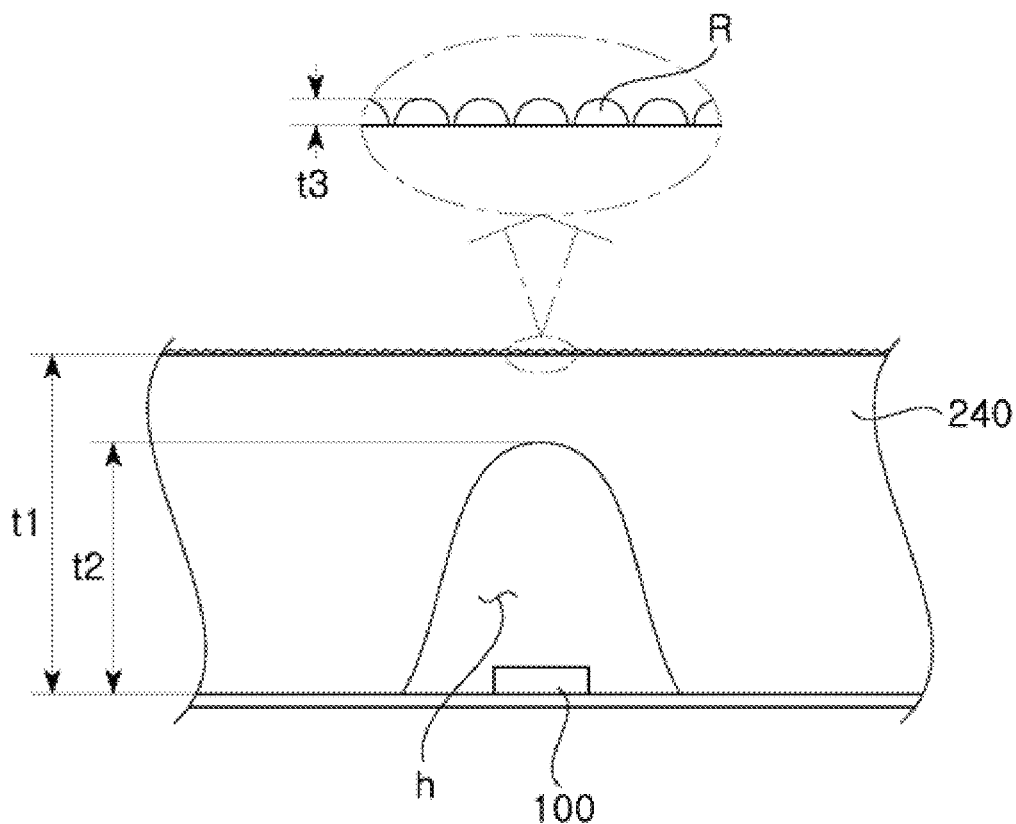
FIG. 3 is a sectional view of a light guide plate of the display apparatus according to the first exemplary embodiment of the inventive concepts.

FIG. 3 is a sectional view of a light guide plate of the display apparatus according to the first exemplary embodiment of the inventive concepts. The light guide plate 240 of the display apparatus 200 will be described in more detail with reference to FIG. 3.

Referring to FIG. 3, a plurality of light emitting diode packages 100 is disposed on the frame 210, and a relationship between one of the light emitting diode packages 100 and the light guide plate 240 will be described together with the shape of the light guide plate 240.

The light guide plate 240 is interposed between the frame 210 and the optical part 220 and has a predetermined area to be disposed over the entirety of the display apparatus 200. The light guide plate 240 has a substantially flat upper surface and may have a roughness R on the upper surface thereof, as needed. The roughness R formed on the upper surface of the light guide plate 240 serves to diffuse light when the light is discharged through the light guide plate 240. Thus, the roughness R may be formed in a predetermined pattern or may be formed in an irregular diffusion pattern. The irregular diffusion pattern may be formed through corrosion treatment with respect to the upper surface of the light guide plate 240.

The light guide plate 240 may be formed at a lower side thereof with the light source grooves h. The number of light source grooves h may correspond to the number of light emitting diode packages 100 and each of the light source grooves may have a concave shape. The light source groove h may be configured to diffuse light in a lateral direction of the light source groove h when the light enters the light source groove h. Thus, the depth of the light source groove h may be greater than the width thereof.

The light source groove h may have a width gradually decreasing from a lower surface of the light guide plate 240 to an upper surface thereof, and may have a concave upper surface, without being limited thereto. Alternatively, the light source groove h may have a flat upper surface. That is, the light source groove h may have a bell-shaped cross-section.

By way of example, the light guide plate 240 may have a thickness t1 of 0.5 mm to 3.0 mm and the light source groove h may have a depth t2 corresponding to about 70% to about 80% of the thickness of the light guide plate 240. For example, when the light guide plate 240 has a thickness t1 of about 1.3 mm, the depth t2 of the light source groove h may be about 0.9 mm.

The roughness R may have a thickness t3 of 5 µm to 500 µm, for example, about 170 µm.

Figure 4:
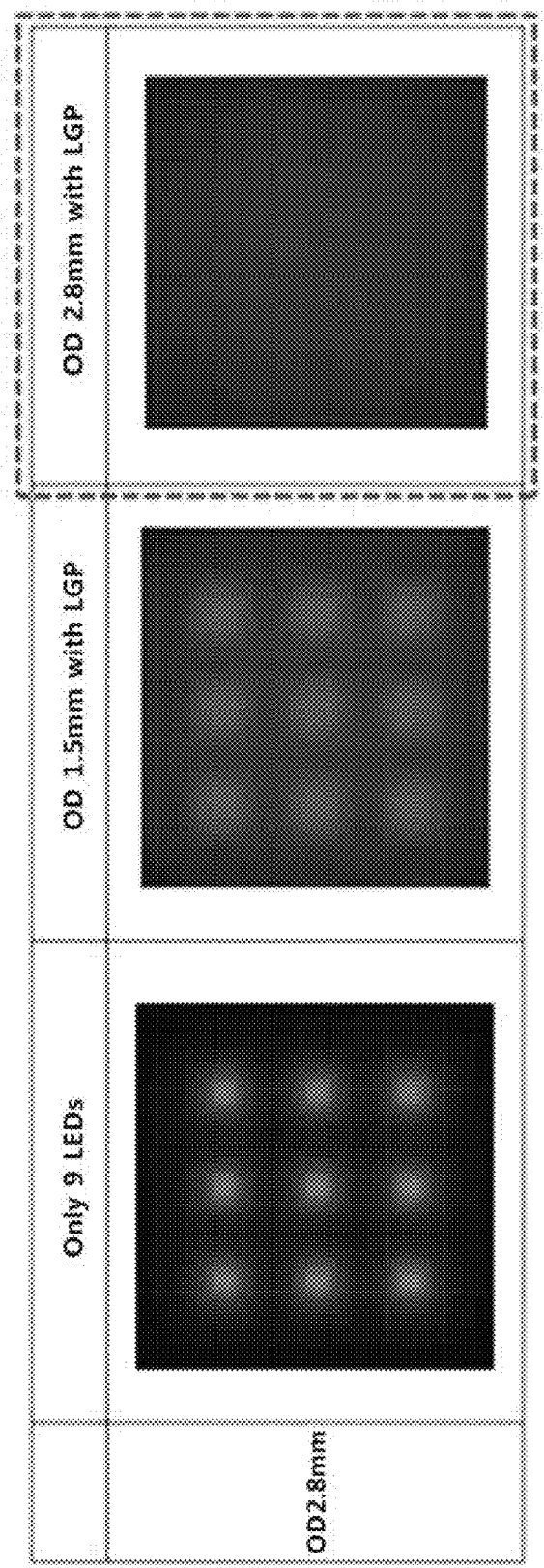
FIG. 4 is a graph comparing light emission through the light guide plate when light is emitted from light emitting diode packages according to the first exemplary embodiment of the inventive concepts.

FIG. 4 is a graph comparing light emission through the light guide plate 240 when light is emitted from the light emitting diode packages according to the first exemplary embodiment of the inventive concepts.

Referring to FIG. 4, in order to confirm uniformity of light emitted from the light emitting diode package 100 due to use of the light guide plate 240 according to the first exemplary embodiment, images of light emitted from the light emitting diode packages 100 without passing through the light guide plate 240 are compared with images of light emitted from the light emitting diode packages 100 and passing through the light guide plate 240. FIG. 4 shows images of light emitted from nine light emitting diode packages 100, in which the OD is set to 2.8 mm.

Referring to a left image of FIG. 4, which shows distribution of light emitted from the nine light emitting diode packages without passing through the light guide plate, it can be confirmed that the light emitted from the light emitting diode packages 100 is not spread and a spot is generated at each of the locations of the light emitting diode packages 100.

Referring to a middle image of FIG. 4, which shows distribution of light emitted from the nine light emitting diode packages and passing through the light guide plate 240 having a thickness of 1.5 mm, it can be confirmed that the light emitted from the light emitting diode packages 100 is more uniformly spread than the light shown in the left image and spots are partially generated at the locations of the light emitting diode packages 100.

Referring to a right image of FIG. 4, which shows distribution of light emitted from the nine light emitting diode packages and passing through the light guide plate 240 having a thickness of 2.8 mm, which is the same as the optical distance (OD), it can be confirmed that the light is more uniformly spread than the light shown in the left and middle images.

That is, when light emitted from the light emitting diode packages 100 is discharged through the light guide plate 240, as in this exemplary embodiment, the light guide plate 240 spreads the light around the light emitting diode packages 100, whereby the light can be uniformly discharged through a light exit surface of the light guide plate 240.

Figure 5:
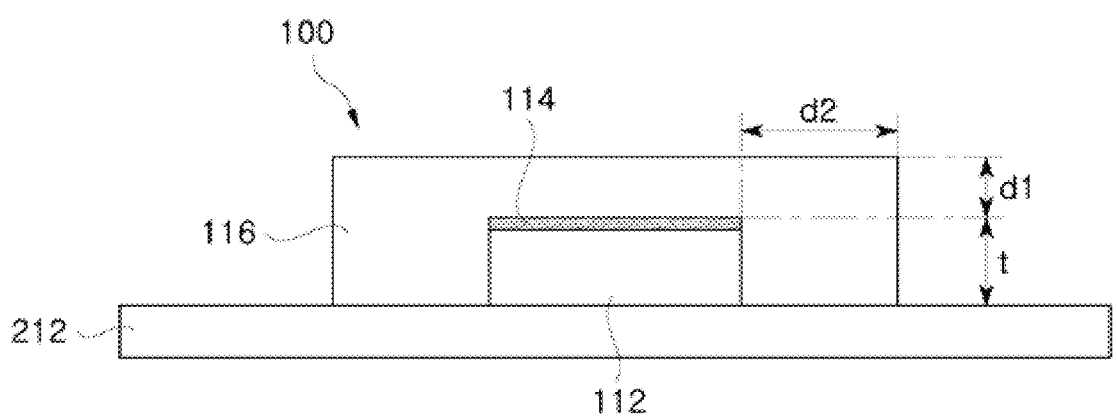
FIG. 5 is a sectional view of a light emitting diode package of the display apparatus according to the first exemplary embodiment of the inventive concepts.

FIG. 5 is a sectional view of the light emitting diode package of the display apparatus according to the first exemplary embodiment of the inventive concepts.

Referring to FIG. 5, the light emitting diode package 100 according to the first exemplary embodiment of the inventive concepts will be described in more detail. As shown in FIG. 5, the light emitting diode package 100 includes a light emitting diode chip 112, a reflector 114, and a molding part 116.

The light emitting diode chip 112 may include an n-type semiconductor layer, an active layer, and a p-type semiconductor layer. Here, each of the n-type semiconductor layer, the active layer, and the p-type semiconductor layer may include a Group III-V-based compound semiconductor. For example, each of the n-type semiconductor layer, the active layer, and the p-type semiconductor layer may include a nitride semiconductor such as (Al, Ga, In)N.

The n-type semiconductor layer may be a conductive semiconductor layer containing n-type dopants (for example, Si) and the p-type semiconductor layer may be a conductive semiconductor layer containing p-type dopants (for example, Mg). The active layer is interposed between the n-type semiconductor layer and the p-type semiconductor layer, and may have a multi-quantum well (MQW) structure. The composition of the active layer may be determined so as to emit light having a desired peak wavelength.

In this exemplary embodiment, the light emitting diode chip 112 may be a flip-chip type light emitting diode chip 112. In this structure, the light emitting diode chip 112 may be provided at a lower side thereof with an n-type electrode electrically connected to the n-type semiconductor layer and a p-type electrode electrically connected to the p-type semiconductor layer.

When light is emitted from the light emitting diode chip 112, the light is emitted through upper and side surfaces of the light emitting diode chip 112. In this exemplary embodiment, the light emitting diode chip 112 may have a size of, for example, 670 µm×670 µm×250 µm (length×width×thickness).

The reflector 114 may be disposed on the light emitting diode chip 112 so as to cover the entirety of an upper surface of the light emitting diode chip 112. In this exemplary embodiment, the reflector 114 may reflect light emitted from the light emitting diode chip 112 or may allow some fractions of light emitted from the light emitting diode chip 112 to be transmitted therethrough while reflecting the remaining fraction of the light.

By way of example, the reflector 114 may include a distributed Bragg reflector (DBR). The distributed Bragg reflector may be formed by alternately stacking material layers having different indices of refraction. The distributed Bragg reflector can reflect the entirety or part of light emitted from the light emitting diode chip 112 depending upon the number of material layers constituting the distributed Bragg reflector. In addition, the reflector 114 may include a metal or other materials, instead of the distributed Bragg reflector, as needed. For example, the reflector 114 may have a light transmittance of 0% to 80%.

Here, the distributed Bragg reflector may be formed through molecular beam epitaxy, E-beam evaporation, ion-beam assisted deposition, reactive plasma deposition, or sputtering.

Referring to FIG. 5, the molding part 116 may be disposed to cover the entirety of the light emitting diode chip 112, on which the reflector 114 is disposed. That is, the molding part 116 may be disposed to cover the upper and side surfaces of the light emitting diode chip 112 excluding the n-type electrode and the p-type electrode disposed on the lower side of the light emitting diode chip 112.

The molding part 116 may be formed of a transparent material, for example, silicone, so as to allow light emitted from the light emitting diode chip 112 to pass therethrough.

In this exemplary embodiment, the molding part 116 is formed to cover the light emitting diode chip 112 and may have a size of, for example, 1,500 µm×1,500 µm×420 µm (length×width×thickness). That is, the thickness of the molding part 116 may be greater than or equal to the sum of a thickness t of the light emitting diode chip 112 and a thickness d1 (hereinafter, first thickness) of the molding part 116 from the upper surface of the light emitting diode chip 112 to an upper surface of the molding part 116. Here, the first thickness d1 of the molding part 116 may be less than or equal to the thickness t of the light emitting diode chip 112 (d1≤t).

In addition, a width d2 (hereinafter, first width) of the molding part 116 from a side surface of the light emitting diode chip 112 to a side surface of the molding part 116 may be greater than the first thickness d1. In this exemplary embodiment, the first width d2 of the molding part 116 may be 1.5 times to 4 times, for example, about 2.44 times the first thickness d1.

In other words, the molding part 116 is formed such that the thickness d1 of the molding part 116 formed on the upper surface of the light emitting diode chip 112 is less than the width d2 of the molding part 116 formed on the side surface of the light emitting diode chip 112. Light emitted from the light emitting diode chip 112 is blocked by the reflector disposed on the upper surface of the light emitting diode chip and can be mostly emitted in the lateral direction of the light emitting diode chip 112. Furthermore, light emitted from the light emitting diode chip 112 is guided by the shape of the molding part 116 formed on the upper and side surfaces of the light emitting diode chip 112 to be more efficiently discharged in the lateral direction.

As such, since the light emitting diode package 100 including the molding part 116 formed to cover the light emitting diode chip 112 allows light emitted from the light emitting diode chip 112 to be discharged through the side surface thereof rather than the upper surface thereof, the light emitting diode package can be used as a light source for a backlight unit of the display apparatus 200. Furthermore, when light is emitted from the light emitting diode package 100, the light is refracted in the lateral direction while passing through the light guide plate 240, thereby providing uniform light throughout the display panel 227 of the display apparatus 200.

Particularly, since the light emitting diode package 100 allows light to be discharged in the lateral direction thereof, it is possible to omit a lens for diffusing light. In this exemplary embodiment, the light source groove h of the light guide plate 240 can act as a lens. In a direct type backlight unit, the lens serves to spread light in the lateral direction upon receiving light from the light emitting diode package 100. According to this exemplary embodiment, since the light is spread in the lateral direction of the light emitting diode package 100 when the light enters the light guide plate 240 through the light source groove h of the light guide plate 240, it is possible to omit the need for a separate lens.

As such, since the display apparatus 200 according to this first exemplary embodiment does not employ a separate lens, it is possible to minimize the thickness of the display apparatus.

Further, the molding part 116 may be formed of a transparent material alone, or may further include at least one type of phosphor or at least one type of light diffuser for regulating light diffusion. In this exemplary embodiment, since the optical part 220 includes the phosphor sheet 221 as described above, the molding part 116 can omit a separate phosphor. Alternatively, in order to improve color reproduction of light emitted through the phosphor sheet 221 in the optical part 220, the molding part 116 may contain at least one type of phosphor.

In this exemplary embodiment, the light emitting diode package 100 is illustrated as including the light emitting diode chip 112, the reflector 114 and the molding part 116. Alternatively, at least one of the reflector 114 and the molding part 116 may be omitted.

Specifically, the light emitting diode package 100 may include the light emitting diode chip 112 alone such that the light emitting diode chip 112 is disposed in the light source groove h of the light guide plate 240. With this structure, light emitted from the light emitting diode chip 112 can be spread in the lateral direction through the light guide plate 240.

Alternatively, the light emitting diode package 100 may include the light emitting diode chip 112 and the reflector 114 without the molding part. With this structure, the reflector 114 can increase the amount of light discharged in the lateral direction by reflecting more light in the lateral direction than in the upward direction when the light is emitted from the light emitting diode chip 112.

Figure 6:
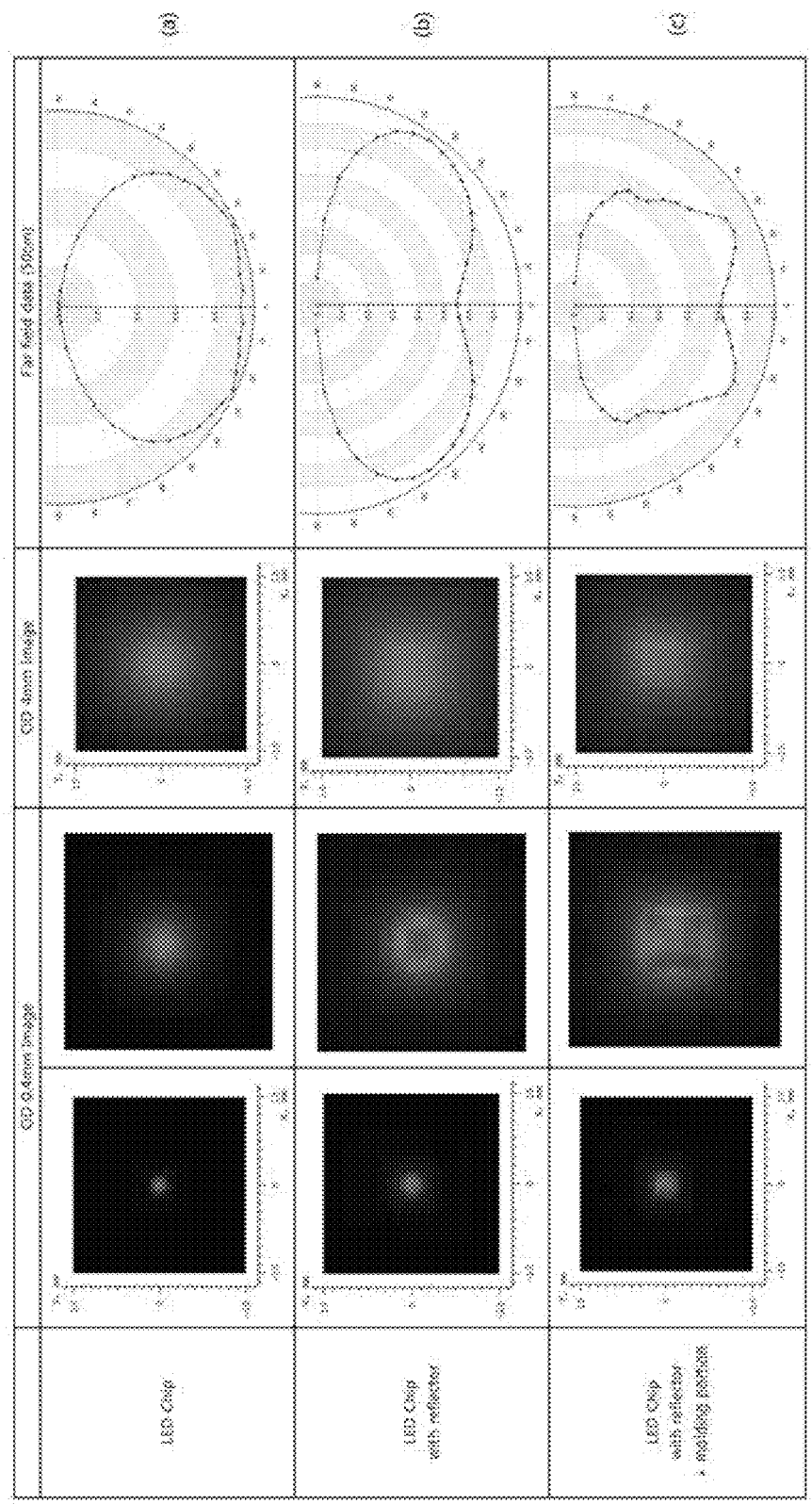
FIG. 6 is a graph comparing light emission from the light emitting diode package of the display apparatus according to the exemplary embodiment of the inventive concepts.

FIG. 6 is a graph comparing light emission from the light emitting diode package according to the first exemplary embodiment of the inventive concepts.

FIG. 6 shows images and beam angles of light emitted from the light emitting diode package according to the first exemplary embodiment of the inventive concepts. First, Images in (a) include far field data of images of light emitted from the light emitting diode chip 112 and photographed at an OD of 0.4 mm, at an OD of 4 mm and at an OD of 50 cm, respectively. Images in (b) include far field data of images of light emitted from the light emitting diode chip 112 with the reflector 114 disposed on the upper side thereof, and photographed at an OD of 0.4 mm, at an OD of 4 mm and at an OD of 50 cm, respectively. Images in (c) include far field data of images of light emitted from the light emitting diode chip 112 with the reflector 114 and the molding part 116 disposed thereon, and photographed at an OD of 0.4 mm, at an OD of 4 mm and at an OD of 50 cm, respectively.

It can be confirmed from the images and the far field data that the reflector 114 and the molding part 116 formed on the light emitting diode chip 112 allow uniform spreading of light emitted from the light emitting diode package 100.

Figure 7:
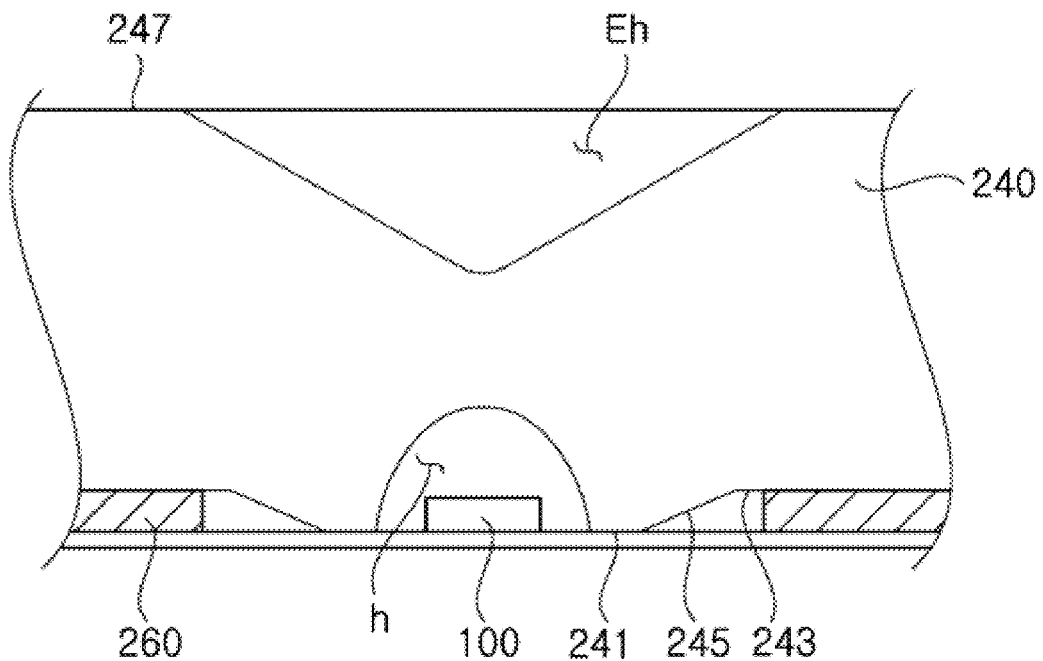
FIG. 7 is a sectional view of a light guide plate of a display apparatus according to a second exemplary embodiment of the inventive concepts.

FIG. 7 is a sectional view of a light guide plate of a display apparatus according to a second exemplary embodiment of the inventive concepts.

A display apparatus 200 according to a second exemplary embodiment of the inventive concepts includes a light emitting diode package 100, a front cover 230, a frame 210, an optical part 220, a light guide plate 240, and a reflection sheet 260. In description of the display apparatus 200 according to this exemplary embodiment, descriptions of the same components as those of the first exemplary embodiment will be omitted.

The following description will be given of features of the second exemplary embodiment, that is, the light guide plate 240 and the reflection sheet 260, that are different from those of the first exemplary embodiment with reference to FIG. 7.

The light guide plate 240 is interposed between the frame 210 and the optical part 220 and serves to achieve uniform emission of light towards an upper surface 247 of the light guide plate 240 by spreading light emitted from a plurality of light emitting diode packages 100 disposed on the frame 210 in the lateral direction. To this end, the light guide plate 240 is provided at a lower side thereof with light source grooves h each receiving the light emitting diode package 100. As in the first exemplary embodiment, the number of light source grooves h may correspond to the number of light emitting diode packages 100 and each of the light sources h may have a concave shape. The concave shape of the light source groove is formed to spread light emitted from the light emitting diode package 100 to a plane direction of the light guide plate 240 and may have a bell shape, as shown in FIG. 7, or other shapes as needed.

Although the depth and width of the light source groove h may be the same as those of the light source groove h of the light guide plate according to the first exemplary embodiment, the depth of the light source groove according to this exemplary embodiment may be less than the depth of the light source groove according to the first exemplary embodiment. This structure results from the structure of the light guide plate having light exit grooves Eh formed above the light source grooves h.

Each of the light exit grooves Eh is formed above the light source groove h and the number of light exit grooves Eh corresponds to the number of light source grooves h. Referring to FIG. 7, the light exit grooves Eh may have a conical shape and have widths greater than those of the light source grooves h. In addition, the width of the light exit groove Eh may be greater than the depth thereof.

Each of the light exit grooves Eh serves to reflect light on an inner surface thereof to spread in the lateral direction (plane direction) of the light guide plate 240 when the light emitted from the light emitting diode package 100 enters the light guide plate 240 through the light source groove h.

Accordingly, an inner tip (vertex of the conical shape) of the light exit groove (Eh) may have a gently curved surface instead of a sharp shape, or may have a flat surface as needed. In addition, although the light exit groove Eh is shown as having a linear inclined surface 245 in the cross-sectional view of FIG. 7, the light exit groove Eh may have a concave inclined surface as shown in the inclined surface 245 of the light source groove h, or a convex inclined surface as needed.

The uppermost end of the light exit groove Eh extends to the upper surface 247 of the light guide plate 240. The upper surface 247 of the light guide plate 240 may be a light exit surface through which the light exits the light guide plate 240. In this exemplary embodiment, the upper surface 247 of the light guide plate 240 may be a substantially flat surface, without being limited thereto. Alternatively, the upper surface 247 of the light guide plate 240 may not be flat or may have a roughness as needed.

With the structure wherein the light guide plate has the light exit grooves Eh formed above light source grooves h as described above, light emitted from the light emitting diode package 100 is spread over the light guide plate 240 to be uniformly discharged through the upper surface 247 of the light guide plate 240.

The reflection sheet 260 may be disposed on the lower surface of the light guide plate 240. The reflection sheet 260 serves to increase the amount of light discharged through the upper surface of the light guide plate 240 when the light enters the light guide plate 240.

The reflection sheet 260 may have a thickness of, for example, about 120 μm to 250 μm, which is similar to the thickness (for example, 150 μm to 350 μm) of the light emitting diode package 100. Thus, the reflection sheet 260 may be separated from the light emitting diode package 100 by a predetermined distance or more in order to prevent light emitted from the light emitting diode package 100 from being lost through reflection by a side surface of the reflection sheet 260.

Further, since the light emitting diode package 100 and the light guide plate 240 are disposed on a substrate 212 mounted on the frame 210 and the reflection sheet 260 is disposed on the lower surface of the light guide plate 240, the lower surface of the light guide plate 240 has a step due to the thickness of the reflection sheet 260. That is, the lower surface of the light guide plate 240 includes a first lower surface 241 and a second lower surface 243, and the step is formed between the first lower surface 241 and the second lower surface 243.

The first lower surface 241 may adjoin the substrate 212 on which the light emitting diode chip 112 is disposed, and the second lower surface 243 may adjoin the reflection sheet 260. As such, the step is formed between the second lower surface 243 and the first lower surface 241 due to the thickness of the reflection sheet 260.

Furthermore, the first lower surface 241 may extend from a distal end of the light source groove h and an inclined surface 245 may be formed between the first lower surface 241 and the second lower surface 243. The inclined surface 245 serves to connect both ends of the step formed between the first lower surface 241 and the second lower surface 243. With this structure, light entering the light guide plate through the light source groove h can be reflected by the inclined surface 245 towards the upper surface of the light guide plate 240. Further, the structure of the light guide plate including the inclined surface 245 can prevent the light emitted from the light emitting diode chip 112 from directly reaching the side surface of the reflection sheet 260, thereby minimizing loss of light through reflection by the side surface of the reflection sheet 260.

In other exemplary embodiments, the light guide plate may include the inclined surface 245 directly extending from the distal end of the light source groove h to the second lower surface 243 by omitting the first lower surface 241, as needed.

As such, when light emitted from the light emitting diode chip 112 received in the light source groove h of the light guide plate 240 on the substrate 212 enters the light guide plate 240 through the light source groove h, the light can be discharged through the upper surface 247 of the light guide plate 247 while being reflected by some portions of the light guide plate 240 to spread in the lateral direction of the light guide plate 240. Here, the light exit grooves Eh formed on the light guide plate 240 and placed corresponding to the light source groove h can improve efficiency of spreading light in the lateral direction of the light guide plate 240.

Furthermore, the reflection sheet 260 disposed on the lower surface of the light guide plate 240 can increase the amount of light discharged through the upper surface 247 of the light guide plate 240. In order to prevent loss of light emitted from the light emitting diode chip 112 due to reflection by the side surface of the reflection sheet, the light emitting diode chip 112 may be separated from the reflection sheet 260 by a predetermined distance or more. Furthermore, the light source groove h and the inclined surface 245 of the light guide plate 240 are disposed between the light emitting diode chip 112 and the reflection sheet 260 to prevent light emitted from the light emitting diode chip 112 from directly reaching the side surface of the reflection sheet 260, thereby minimizing loss of light through reflection by the side surface of the reflection sheet 260.

Figure 8:
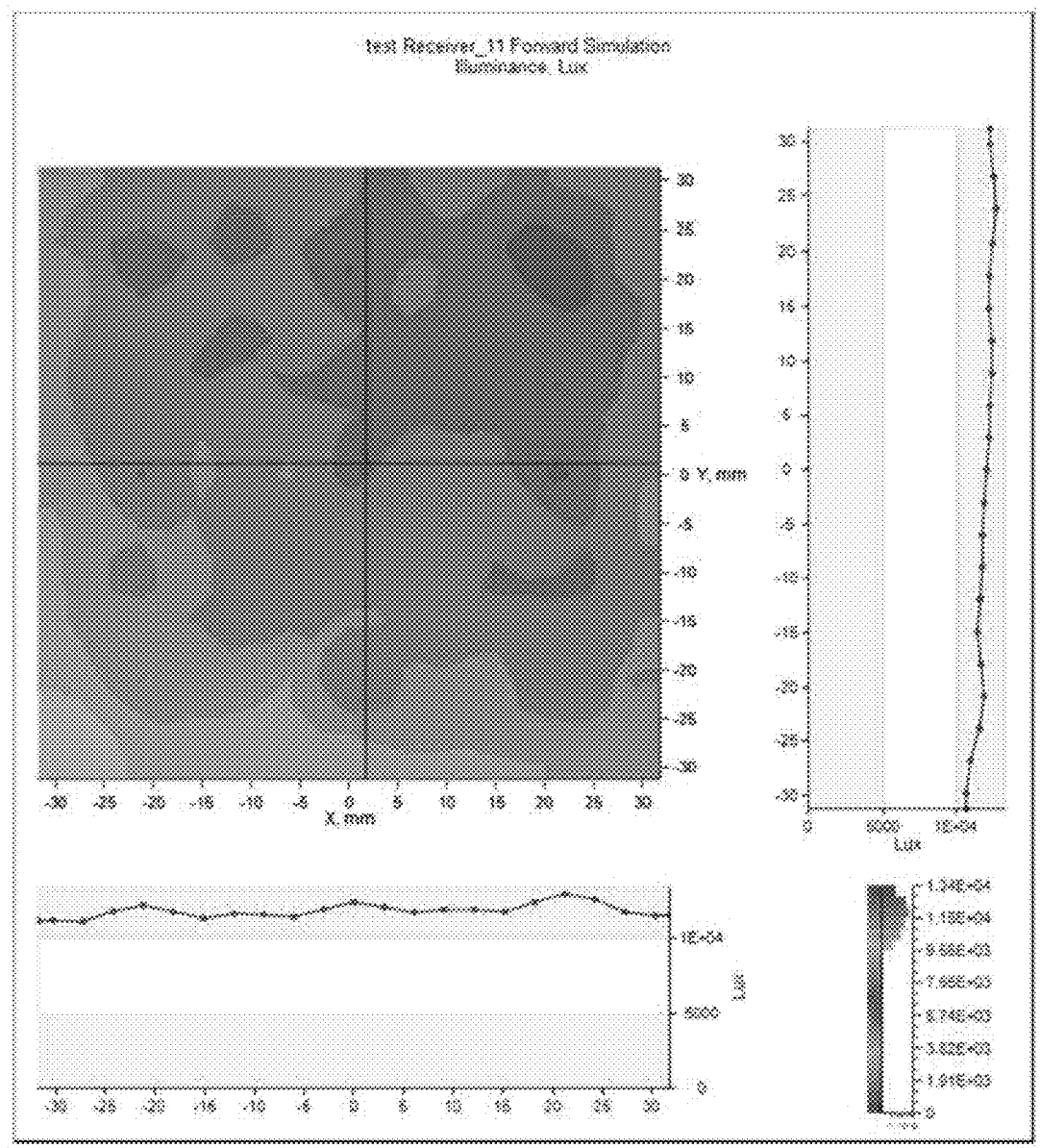
FIG. 8 shows simulation images of light emitted from the display apparatus according to the second exemplary embodiment of the inventive concepts.

FIG. 8 shows simulation images of light emitted from the display apparatus according to the second exemplary embodiment of the inventive concepts.

FIG. 8 shows simulation results as to uniformity of light discharged from the display apparatus 200 according to the second exemplary embodiment of the inventive concepts, in which the light emitting diode packages 100 are disposed. For simulation, the light guide plate 240 and the reflection sheet 260 according to this exemplary embodiment were disposed on the light emitting diode packages 100, and the light guide plate 240 was covered only by a brightness enhancement film (BEF) and a diffusion sheet. FIG. 8 shows only part of the display apparatus.

From the simulation results and the graphs in the x-axis and y-axis directions shown in FIG. 8, it can be seen that the display apparatus generally had a light distribution of 9.56E+03 or more and the light distribution had a substantially linear shape both in the x-axis direction and in the y-axis direction. Although only part of the display apparatus 200 is shown in FIG. 8, it can be confirmed that the intensity of light was maintained at a certain level or higher and the light was generally uniformly discharged through the display apparatus.

Accordingly, it can be seen that light emitted from the light emitting diode packages 100 can be uniformly spread in the light guide plate 240 and thus, can be uniformly discharged as surface light through the upper surface 247 of the light guide plate 240, which is the light exit surface.

Figure 9A:
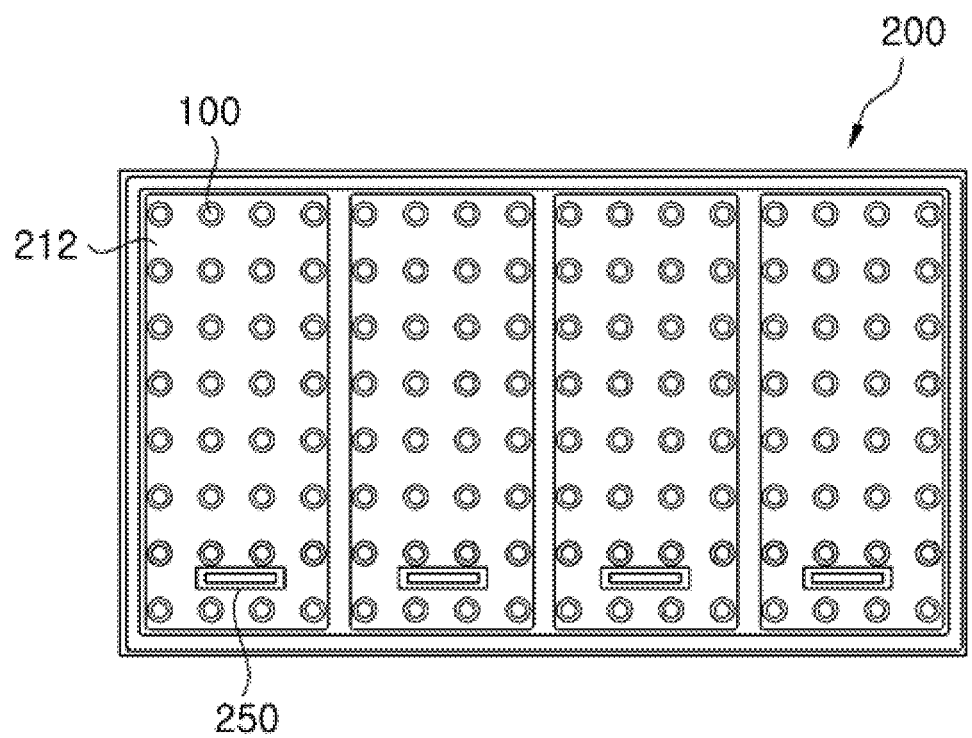
FIG. 9A is a top view of a display apparatus according to one exemplary embodiment of the inventive concepts.
Figure 9B:
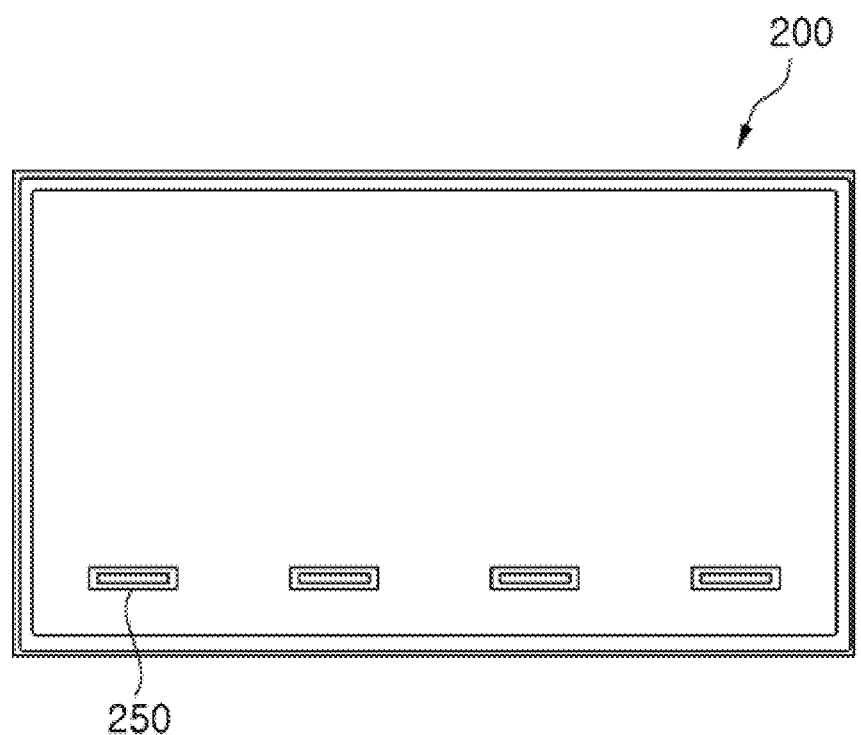
FIG. 9B is a bottom view of the display apparatus according to the exemplary embodiment of the inventive concepts.
Figure 10A:
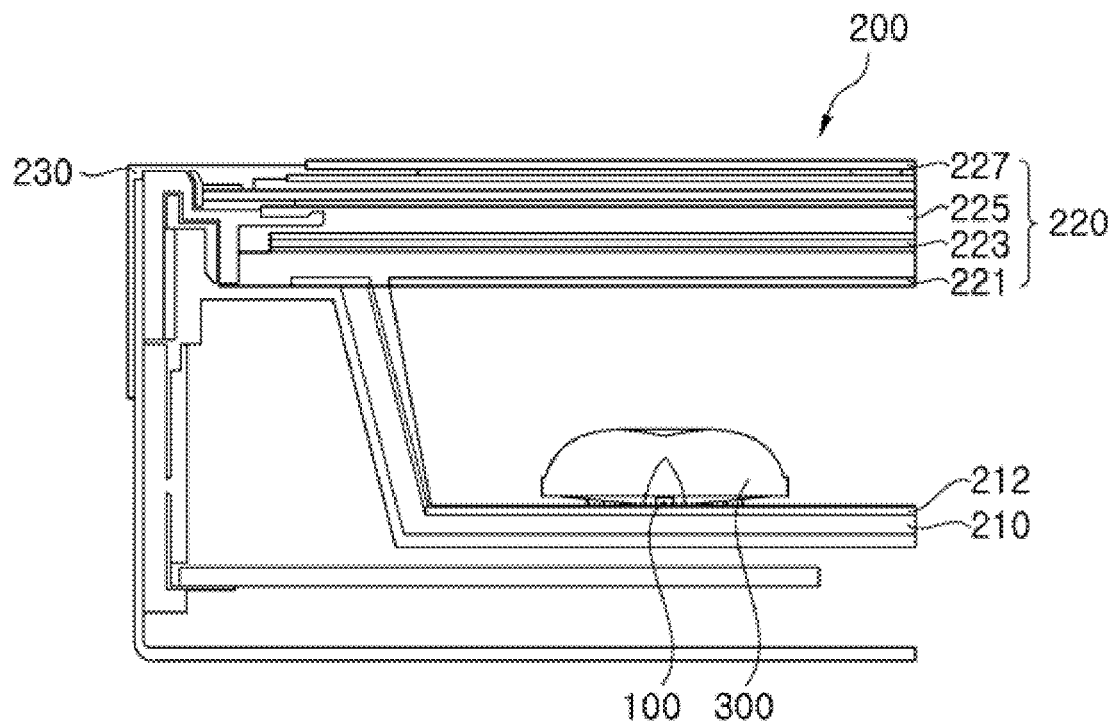
FIG. 10A and FIG. 10B are cross-sectional views of the display apparatus according to the exemplary embodiment of the inventive concepts.
Figure 10B:
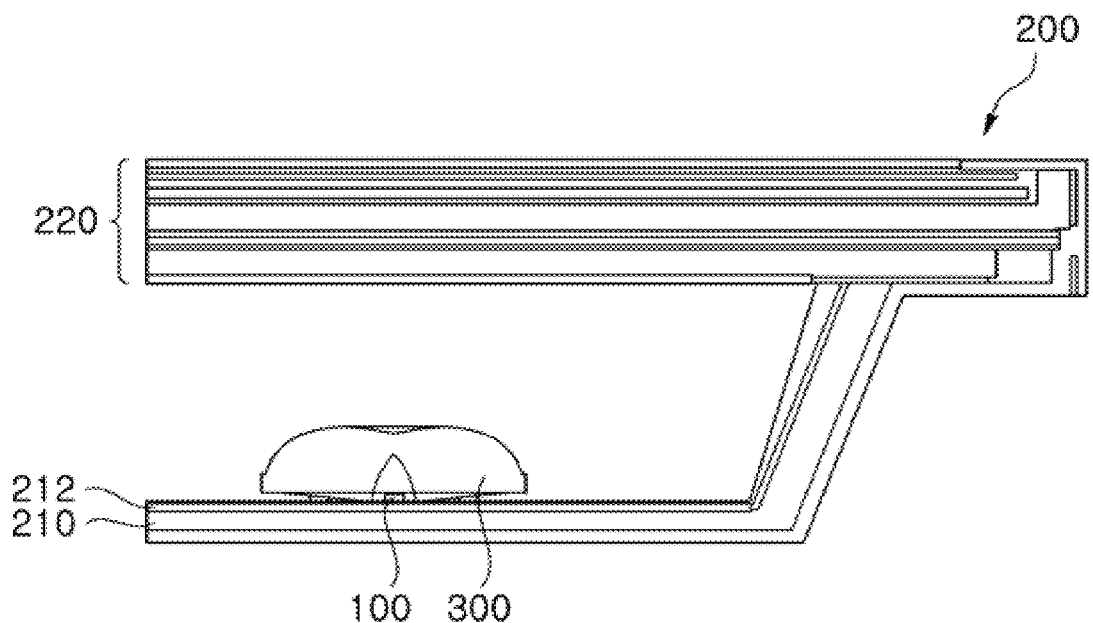

FIG. 9A and FIG. 9B are top and bottom views of a display apparatus according to one exemplary embodiment of the inventive concepts, respectively, and FIG. 10A and FIG. 10B are cross-sectional views of the display apparatus according to the exemplary embodiment of the inventive concepts.

A display apparatus 200 according to one exemplary embodiment of the inventive concepts includes light emitting diode packages 100, a front cover 230, a frame 210, an optical part 220, and lenses 300. Each of the light emitting diode packages 100 includes a light emitting diode chip 112, a reflector 114, and a molding part 116, which will be described below.

The front cover 230 may cover part of side and upper surfaces of a display panel 227 of the optical part 220. The front cover 230 may have a hollow center and the display panel 227 may be disposed at the center of the front cover 230 such that an image displayed on the display panel 227 can be viewed outside the display apparatus.

The frame 210 may support the display apparatus 200 and may be coupled at one side thereof to the front cover 230. The frame 210 may be formed of a synthetic resin or a metallic material such as an Al alloy. The frame 210 may be separated by a predetermined distance from the optical part 220. The light emitting diode package 100 may be disposed on the frame 210 so as to face the optical part 220. Here, a distance between the frame 210 and the optical part 220 may be an optical distance (OD) from the light emitting diode package 100 to the optical part 220. In this exemplary embodiment, the optical distance (OD) may be, for example, about 1 mm to 15 mm.

The frame 210 may be provided at an upper side thereof with a substrate 212, to which the light emitting diode package 100 is electrically connected. The substrate 212 serves to allow power supply to the light emitting diode package 100 therethrough.

The optical part 220 is disposed above the frame 210, and includes a phosphor sheet 221, a diffusion plate 223, an optical sheet 225 and the display panel 227.

The phosphor sheet 221 serves to perform wavelength conversion of light emitted from the light emitting diode package 100. The phosphor sheet 221 may contain at least one type of phosphor and may further include at least one type of quantum dot (QD). In this exemplary embodiment, the light emitting diode package 100 may emit blue light or UV light, and light emitted through the phosphor sheet 221 may be white light.

The diffusion plate 223 serves to diffuse light in an upward direction upon receiving the light from the light emitting diode package 100.

The optical sheet 225 may be disposed on the diffusion plate 223 and the display panel 227 may be dispose on the optical sheet 225. The optical sheet 225 may include a plurality of sheets having different functions. By way of example, the optical sheet 225 may include one or more prism sheets and diffusion sheets. The diffusion sheet can provide more uniform brightness by preventing light emitted through the diffusion plate 223 from being partially collected. The prism sheet can collect light emitted through the diffusion sheet to allow the light to enter the display panel 227 at a right angle.

The display panel 227 is disposed on an upper surface of the display apparatus 200 and displays an image. The display panel 227 includes a plurality of pixels and can output an image corresponding to a color, brightness, and chroma of each pixel.

In addition, the display apparatus may be provided with a plurality of power supply units 250, which supply electric power to the plurality of light emitting diode packages 100. Each power supply unit 250 can supply power to at least one light emitting diode package 100. In this exemplary embodiment, electric power is supplied to 32 light emitting diode packages 100 through one power supply unit 250. Upon receiving electric power from the power supply unit 250, the plurality of light emitting diode packages 100 can emit light and be individually operated.

Referring to FIG. 10A and FIG. 10B, each of the lenses 300 is disposed on the frame 210 between the frame 210 and the optical part 220. The lens 300 serves to guide light emitted from the light emitting diode package 100 to travel in a lateral direction of the lens 300. This structure will be described in detail with reference to FIG. 11.

Figure 11:
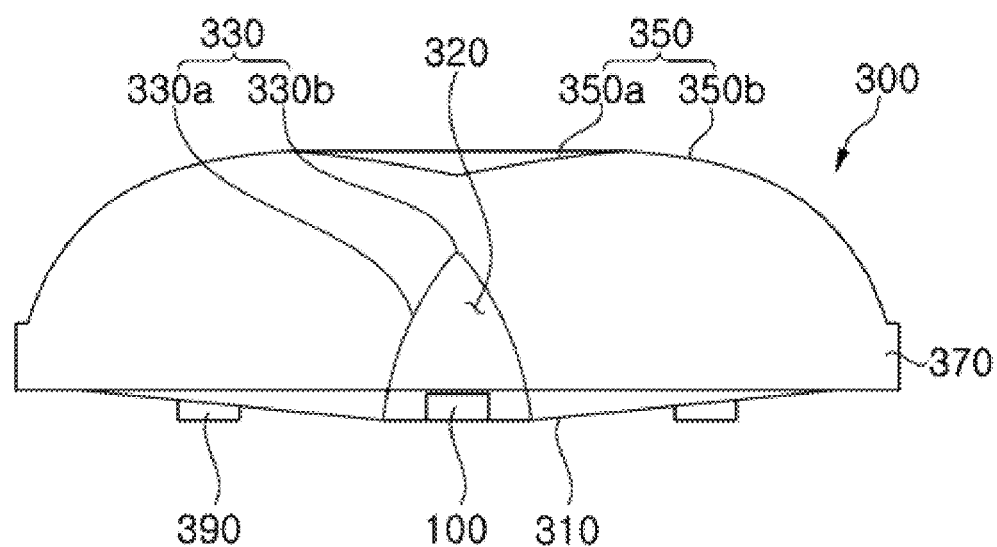
FIG. 11 is a sectional view of a lens of the display apparatus according to the exemplary embodiment of the inventive concepts.

FIG. 11 is a sectional view of a lens of the display apparatus according to the exemplary embodiment of the inventive concepts.

The lens 300 shown in FIG. 11 is provided for illustration only, and the shape of the lens 300 can be modified, as needed.

An optical distance (OD) corresponding to a distance from the frame 210 to the optical part 220 can be adjusted depending upon the height of the lens 300. The lens 300 is disposed on the frame 210 such that an upper surface 350 of the lens 300 closely adjoins the optical part 220. Alternatively, an air gap may be formed between the upper surface 350 of the lens 300 and the optical part 220. That is, the OD can be adjusted as needed.

Referring to FIG. 11, in this exemplary embodiment, the lens 300 includes a lower surface 310, an upper surface 350, a flange 370, and legs 390. The lower surface 310 may include a concave portion 320 and an inclined surface surrounding the concave portion 320. In some exemplary embodiments, a flat surface may be disposed between the concave portion 320 and the inclined surface, as needed.

The inclined surface serves to allow light emitted from the light emitting diode package 100 and entering the lens 300 to be discharged through a side surface of the lens 300 without total internal reflection, and an inclination of the inclined surface depends upon the shape of the lens 300.

The concave portion 320 defines a light incident face 330 through which light emitted from the light emitting diode package 100 enters the lens 300. That is, the light incident face 330 is an inner surface of the concave portion 320 and includes a side surface 330a and an upper end portion 330b. The concave portion 320 has a shape gradually decreasing in width from an entrance thereof in an upward direction. The side surface 330a may have a constant inclination from the entrance of the concave portion 320 to the upper end portion 330b. Alternatively, the side surface 330a may have an inclination gradually decreasing from the entrance of the concave portion 320 to the upper end portion 330b. That is, the side surface 330a may have a convex shape, as shown in FIG. 11. Referring to FIG. 11, the upper end portion 330b may include a concave surface or may have a flat surface, as needed.

A height of the concave portion 320 may be adjusted depending upon a beam angle of the light emitting diode package 100, the shape of the upper surface 350 of the lens 300, directional distribution of light, and the like.

The upper surface 350 of the lens 300 is configured to allow light having entered the lens 300 to spread in a wide directional distribution, and acts as a light exit surface through which light exits the lens 300. By way of example, the upper surface 350 of the lens 300 may include a concave surface 350a near a central axis of the lens 300 and a convex surface 350b extending from the concave surface 350a. The concave surface 350a guides light traveling near the central axis of the lens 300 to be directed outwards, and the convex surface 350b increases the amount of light traveling outward from the central axis of the lens 300.

The flange 370 connects the upper surface 350 to the lower surface 310 and defines the size of the lens 300. A side surface of the flange 370 and the lower surface 310 may have a roughened pattern, as needed. The legs 390 of the lens 300 are coupled to the frame 210 to secure the lens 300. By way of example, a leading end of each leg 390 may be bonded to the frame 210 by a bonding agent and the like.

The light emitting diode package 100 described below may be disposed on the frame 210 and the lens 300 may be disposed on the light emitting diode package 100. Here, the lens 300 may be disposed on the frame 210 such that the light emitting diode package 100 is placed inside the concave portion 320. With this structure, light emitted from the light emitting diode package 100 can enter the lens 300 through the light incident face 330 of the concave portion 320.

In this exemplary embodiment, the number of lenses 300 may be the same as the number of light emitting diode packages 100.

Referring to FIG. 9A, the display apparatus 200 includes a plurality of light emitting diode packages 100 regularly arranged thereon. By way of example, the light emitting diode packages 100 may be arranged in a matrix to be separated at constant intervals from each other.

FIG. 9A shows the structure wherein a plurality of light emitting diode packages 100 is regularly arranged. The display apparatus 200 can provide higher quality HDR (high dynamic range) with increasing number of light emitting diode packages 100.

Figure 12:
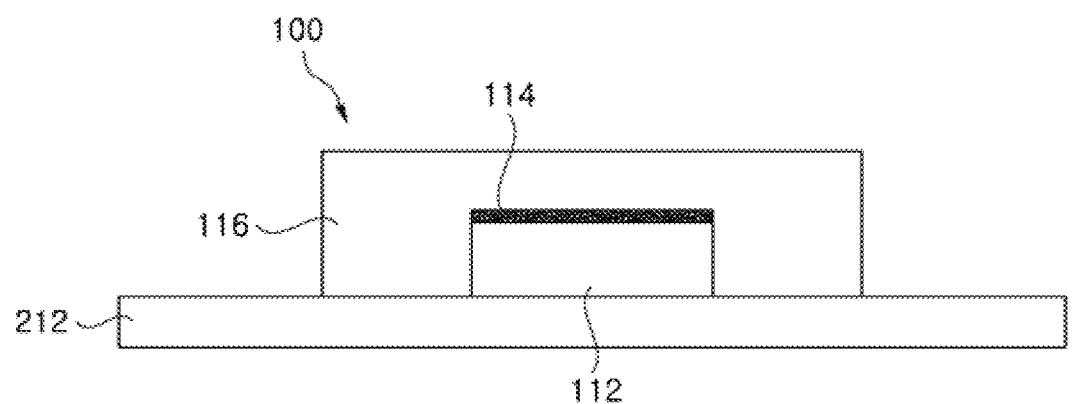
FIG. 12 is a sectional view of a light emitting diode package according to one exemplary embodiment of the inventive concepts.

FIG. 12 is a sectional view of a light emitting diode package according to one exemplary embodiment of the inventive concepts.

Referring to FIG. 12, a light emitting diode package 100 according to one exemplary embodiment of the inventive concepts disclosure will be described in more detail. As shown in FIG. 12, the light emitting diode package 100 includes a light emitting diode chip 112, a reflector 114, and a molding part 116.

The light emitting diode chip 112 may include an n-type semiconductor layer, an active layer, and a p-type semiconductor layer. Here, each of the n-type semiconductor layer, the active layer and the p-type semiconductor layer may include a Group III-V-based compound semiconductor. By way of example, each of the n-type semiconductor layer, the active layer and the p-type semiconductor layer may include a nitride semiconductor such as AlN, GaN, or InN.

The n-type semiconductor layer may be a conductive semiconductor layer containing n-type dopants (for example, Si) and the p-type semiconductor layer may be a conductive semiconductor layer containing p-type dopants (for example, Mg). The active layer is interposed between the n-type semiconductor layer and the p-type semiconductor layer, and may have a multi-quantum well (MQW) structure. The composition of the active layer may be determined so as to emit light having a desired peak wavelength.

In this exemplary embodiment, the light emitting diode chip 112 may be a flip-chip type light emitting diode chip 112. With this structure, the light emitting diode chip 112 may be provided at a lower side thereof with an n-type electrode electrically connected to the n-type semiconductor layer and a p-type electrode electrically connected to the p-type semiconductor layer. When light is emitted from the light emitting diode chip 112, the light is emitted through upper and side surfaces of the light emitting diode chip 112.

The reflector 114 may be disposed on the light emitting diode chip 112 so as to cover the entirety of an upper surface of the light emitting diode chip 112. In this exemplary embodiment, the reflector 114 may reflect light emitted from the light emitting diode chip 112 or may allow some fractions of light emitted from the light emitting diode chip 112 to be transmitted therethrough while reflecting the remaining fraction of the light.

For example, the reflector 114 may include a distributed Bragg reflector (DBR). The distributed Bragg reflector may be formed by alternately stacking material layers having different indices of refraction. The distributed Bragg reflector can reflect the entirety or part of light emitted from the light emitting diode chip 112 depending upon the number of material layers constituting the distributed Bragg reflector. In addition, the reflector 114 may include a metal or other materials, instead of the distributed Bragg reflector, as needed. For example, the reflector 114 may have a light transmittance of greater than 0% to less than 100%, for example, greater than 0% to 95%.

Here, the distributed Bragg reflector may be formed through molecular beam epitaxy, E-beam evaporation, ion-beam assisted deposition, reactive plasma deposition, or sputtering.

Figure 13:
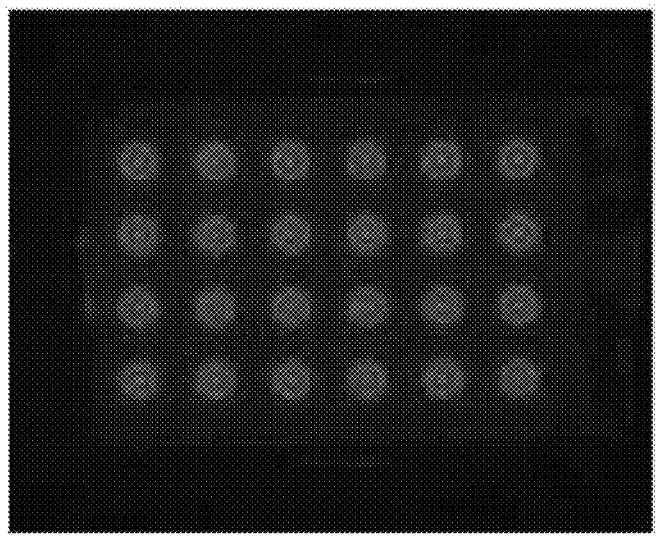
FIG. 13 shows an image of light emitted from a plurality of light emitting diode packages, explaining uniformity of light emitted from the display apparatus according to the exemplary embodiment of the inventive concepts.

Referring to FIG. 13, the molding part 116 may be disposed to cover the entirety of the light emitting diode chip 112, on which the reflector 114 is disposed. That is, the molding part 116 may be disposed to cover the upper and side surfaces of the light emitting diode chip 112 excluding the n-type electrode and the p-type electrode disposed on the lower side of the light emitting diode chip 112.

The molding part 116 may be formed of a transparent material, for example, silicone, so as to allow light emitted from the light emitting diode chip 112 to pass therethrough.

In this exemplary embodiment, the molding part 116 may be formed of a transparent material alone, or may further include at least one type of phosphor or at least one type of light diffuser for regulating light diffusion. In this exemplary embodiment, since the optical part 220 includes the phosphor sheet 221 as described above, the molding part 116 can omit a separate phosphor. Alternatively, in order to improve color reproduction of light emitted through the phosphor sheet 221 in the optical part 220, the molding part 116 may contain at least one type of phosphor.

In this exemplary embodiment, the light emitting diode package 100 is illustrated as including the light emitting diode chip 112, the reflector 114 and the molding part 116. Alternatively, at least one of the reflector 114 and the molding part 116 may be omitted.

Specifically, the light emitting diode package 100 may include the light emitting diode chip 112 alone such that the light emitting diode chip 112 is disposed in the concave portion 320 of the lens 300.

Alternatively, the light emitting diode package 100 may include the light emitting diode chip 112 and the reflector 114 without the molding part. With this structure, the reflector 114 can increase the amount of light discharged in the lateral direction by reflecting more light in the lateral direction than in the upward direction when the light is emitted from the light emitting diode chip 112.

Figure 14:
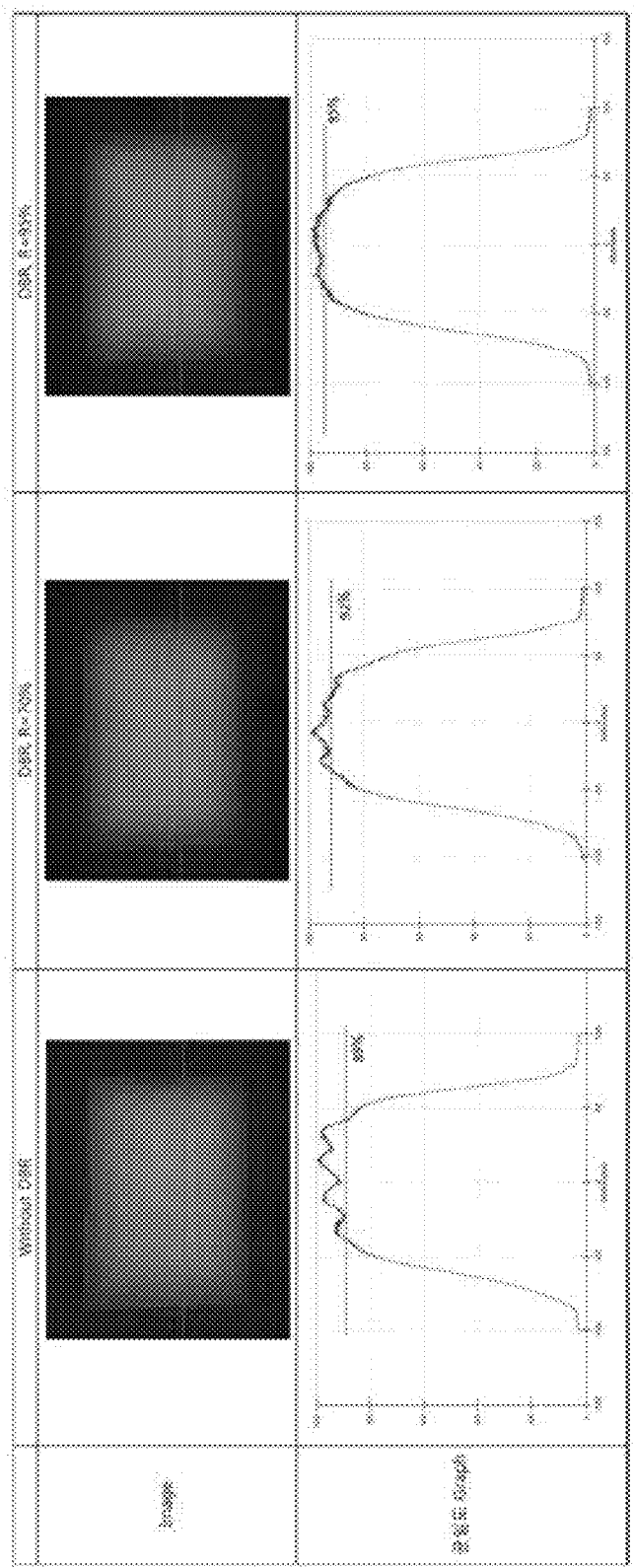
FIG. 14 shows images and graphs comparing uniformity of light emitted from the display apparatus according to the exemplary embodiment of the inventive concepts depending upon structure of light emitting diode packages.
Figure 15:
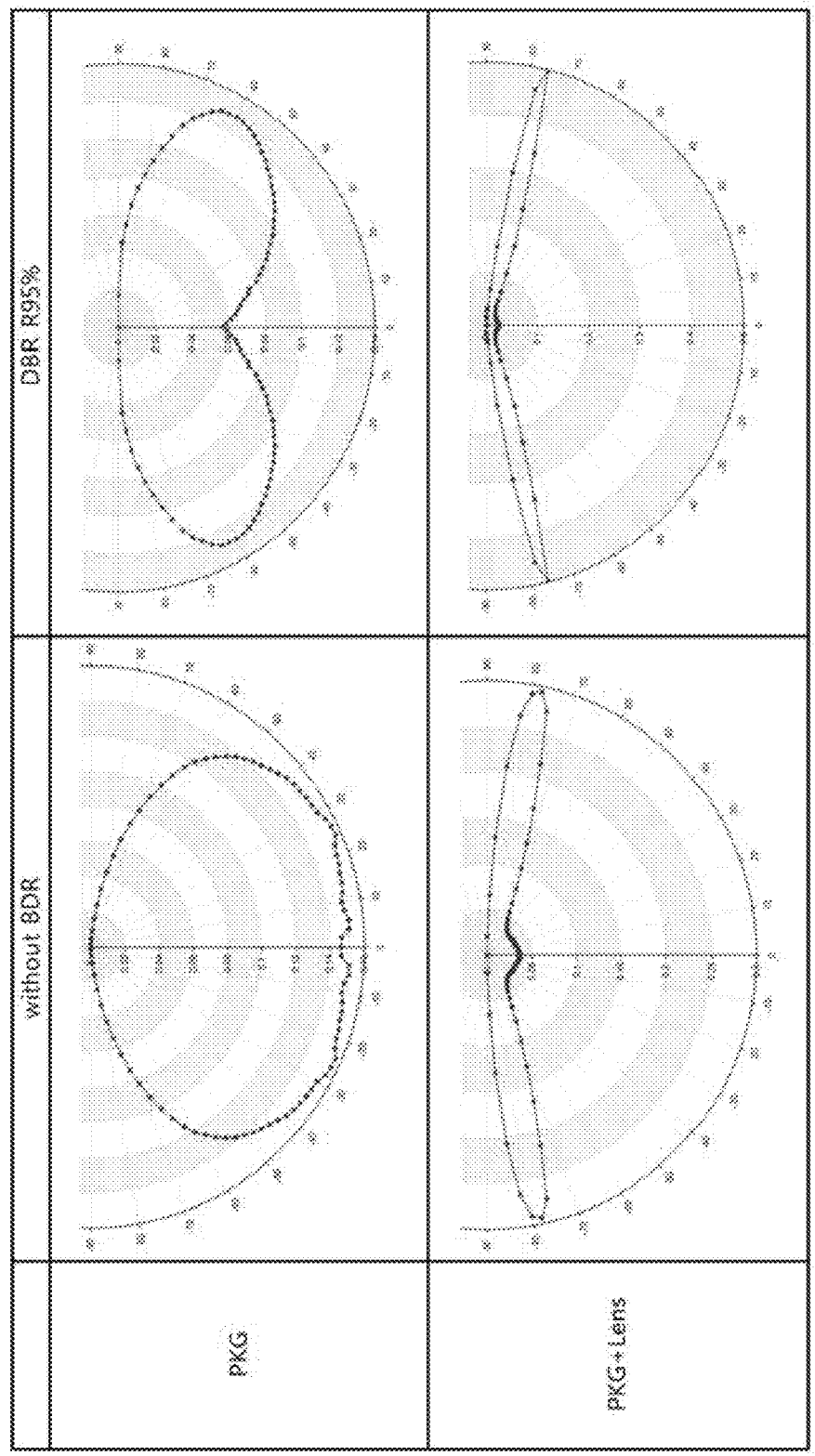
FIG. 15 shows graphs comparing directional characteristics of light emitted from the display apparatus according to the exemplary embodiment of the inventive concepts depending upon structure of light emitting diode packages.

FIG. 13 shows an image of light emitted from a plurality of light emitting diode packages, explaining uniformity of light emitted from the display apparatus according to the exemplary embodiment of the inventive concepts. FIG. 14 shows images and graphs comparing uniformity of light emitted from the display apparatus according to the exemplary embodiment of the inventive concepts depending upon structure of light emitting diode packages and FIG. 15 shows graphs comparing directional characteristics of light emitted from the display apparatus according to the exemplary embodiment of the inventive concepts depending upon structure of light emitting diode packages.

Next, uniformity and directional characteristics of light emitted through the light emitting diode package 100 and the lens 300 in the display apparatus 200 according to the exemplary embodiment will be described with reference to FIG. 14 and FIG. 15. Referring to FIG. 13, 24 light emitting diode packages 100 are coupled to 24 lenses 300, respectively, and the optical distance OD is set to 3 mm.

FIG. 14 shows uniformity of light emitted from the display apparatus depending upon the structure of the light emitting diode packages 100. The first image and graph show results measured using a structure wherein the light emitting diode chip 112 not including the reflector 114 is disposed in the concave portion 320 of the lens 300 and the optical part 220 including the diffusion sheet 223 and the phosphor sheet 221 is disposed above the lens 300. The second image and graph show results measured using a structure wherein the light emitting diode package 100 including the reflector 114 having a reflectivity of 70% and disposed on the light emitting diode chip 112 is disposed in the concave portion 320 of the lens 300 and the optical part 220 including the diffusion sheet 223 and the phosphor sheet 221 is disposed above the lens 300. The third image and graph show results measured using a structure wherein the light emitting diode package 100 including the reflector 114 having a reflectivity of 95% and disposed on the light emitting diode chip 112 is disposed in the concave portion 320 of the lens 300 and the optical part 220 including the diffusion sheet 223 and the phosphor sheet 221 is disposed above the lens 300.

From the measurement results of uniformity obtained using the light emitting diode packages 100 including the different reflectors 114, it could be seen that the light emitting diode package 100 including the reflector 114 having a reflectivity of 95% provided a uniformity degree of 95%, which was about 6% higher than the light emitting diode package 100 not including the reflector 114.

In addition, referring to FIG. 15, from the measurement results of the directional characteristics of light, it could be seen that the light emitting diode package 100 including the reflector 114 having a reflectivity of 95% exhibited better spreading of light in the lateral direction than the light emitting diode package 100 not including the reflector 114. In addition, although the light emitting diode package 100 including the reflector 114 provided high light distribution efficiency, the light distribution efficiency of the light emitting diode package 100 could be further improved through the lens 300 coupled thereto.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A display apparatus comprising:
a frame;
a plurality of light emitting diode packages regularly arranged on the frame; and
an optical part disposed above the plurality of light emitting diode packages and comprising a display panel and at least one of a phosphor sheet and an optical sheet,
wherein each of the light emitting diode packages comprises:
a light emitting diode chip;
a molding part covering an upper surface and side surfaces of the light emitting diode chip, the molding part including a transparent material to transmit light emitted from the light emitting diode chip therethrough; and
a reflector disposed on the upper surface of the light emitting diode chip and contacting the upper surface of the light emitting diode chip, the reflector comprising a distributed Bragg reflector including alternately stacked layers having different indices of refraction to reflect at least part of light emitted from the light emitting diode chip, and
wherein the molding part has a width from one of the side surfaces of the light emitting diode chip to a side surface of the molding part which is 1.5 times to 4 times greater than a thickness of the molding part from the upper surface of the light emitting diode chip to an upper surface of the molding part.

2. The display apparatus according to claim 1, wherein the reflector has a transmittance of greater than 0% and less than 100% with respect to light emitted from the light emitting diode chip.

3. The display apparatus according to claim 1, wherein:
the light emitting diode chip includes an n-type electrode and a p-type electrode disposed on a lower surface thereof; and
the molding part covers the light emitting a diode chip and the reflector excluding the n-type electrode and the p-type electrode of the light emitting diode chip.

4. The display apparatus according to claim 3, wherein the molding part comprises at least one of at least one type of phosphor and at least one type of light diffuser.

5. The display apparatus according to claim 1, wherein the frame includes an inclined side surface forming an angle of less than 90° with respect to a longitudinal direction of the optical part.

6. The display apparatus according to claim 1, further comprising a front cover spaced apart from the frame and including a hollow portion in which the optical part is disposed.

7. The display apparatus according to claim 6, wherein at least a portion of the optical part is disposed closer to the front cover than the frame in a plan view.

8. The display apparatus according to claim 6, further comprising a back cover opposing the front cover, wherein the frame is disposed between the front cover and the back cover.

9. The display apparatus according to claim 1, further comprising a lens disposed between the frame and the optical part to cover each of the light emitting diode packages and configured to spread light emitted from the corresponding light emitting diode package.

10. The display apparatus according to claim 9, wherein: the lens comprises:
   a lower surface having a concave portion defining a light incident face through which light enters the lens; and
   an upper surface through which light exits the lens; and
   the light emitting diode package is disposed inside the concave portion of the lens.

11. The display apparatus according to claim 10, wherein:
   the light incident face of the lens comprises an upper end portion and a side surface extending from the upper end portion to an entrance of the concave portion; and
   the concave portion has a width gradually decreasing from the entrance thereof to the upper end portion.

12. The display apparatus according to claim 11, wherein the side surface of the lens is an inclined surface having a constant inclination from the entrance of the concave portion to the upper end portion or a curved inclined surface having a gradually decreasing inclination from the entrance of the concave portion to the upper end portion.

13. The display apparatus according to claim 11, wherein the upper surface of the lens is a flat surface or a curved surface.

* * * * *